(12) United States Patent
Sharpe

(10) Patent No.: US 10,523,489 B1
(45) Date of Patent: Dec. 31, 2019

(54) POLAR TRANSMITTER WITH ZERO CROSSING AVOIDANCE

(71) Applicant: SAMSUNG ELECTRONICS CO., LTD., Suwon-si, Gyeonggi-do (KR)

(72) Inventor: Jacob Christopher Sharpe, Cambridge (GB)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/188,469

(22) Filed: Nov. 13, 2018

(51) Int. Cl.
*H04L 27/34* (2006.01)
*H04L 27/20* (2006.01)
*H04L 27/36* (2006.01)
*H04L 7/033* (2006.01)

(52) U.S. Cl.
CPC ........ *H04L 27/3405* (2013.01); *H04L 7/0331* (2013.01); *H04L 27/206* (2013.01); *H04L 27/345* (2013.01); *H04L 27/364* (2013.01); *H04L 2203/02* (2013.01)

(58) Field of Classification Search
CPC . H04L 27/3405; H04L 7/0331; H04L 27/345; H04L 27/206; H04L 27/364; H04L 2203/02
USPC ........................................................ 375/296
See application file for complete search history.

(56) References Cited

U.S. PATENT DOCUMENTS

| | | | | |
|---|---|---|---|---|
| 5,805,640 A * | 9/1998 | O'Dea | ................ | H04L 27/2053 332/103 |
| 7,034,614 B2 * | 4/2006 | Robinson | .................. | H03F 1/02 330/136 |
| 7,603,089 B2 * | 10/2009 | Strandberg | ............ | H03F 1/0205 375/296 |
| 8,050,352 B2 * | 11/2011 | Schell | ................... | H03F 1/3247 332/112 |
| 9,000,858 B2 * | 4/2015 | Sun | ...................... | H03C 3/0941 332/119 |
| 2003/0109240 A1 * | 6/2003 | Zipper | .................. | H03F 1/0261 455/323 |
| 2004/0198414 A1 | 10/2004 | Hunton | | |
| 2005/0046507 A1 * | 3/2005 | Dent | ........................ | H03C 3/40 332/103 |

(Continued)

FOREIGN PATENT DOCUMENTS

WO   03010914   2/2003

OTHER PUBLICATIONS

Philippe Pascal, "A zero crossing avoidance predistortion technique for polar transmitters," ICECS 2008. 15th IEEE International Conference on Electronics, Circuits and Systems, 2008, v pp. 814-817, Aug. 31, 2008-Sep. 3, 2008.*

(Continued)

*Primary Examiner* — Juan A Torres
(74) *Attorney, Agent, or Firm* — F. Chau & Associates, LLC

(57) ABSTRACT

A polar transmitter and method thereof generate a filtered IQ waveform in IQ space representing an input bit stream. The filtered IQ waveform is modified to avoid a zero crossing region by intermittently adding thereto a zero crossing avoidance signal with a frequency spectrum comprising at least first and second tones defining first and second peaks on opposite sides of a center-frequency valley. A polar signal comprising a polar amplitude and phase is generated based on the modified IQ waveform. An RF carrier is modulated using the polar signal.

20 Claims, 16 Drawing Sheets

(56) References Cited

U.S. PATENT DOCUMENTS

2009/0257526 A1\* 10/2009 Wang ............... H04L 25/03866
375/298
2009/0258612 A1 10/2009 Zhuang et al.

OTHER PUBLICATIONS

Wang, et al., "Vector Hole Punching Technique for OFDM Signals Using Circle-Tangent Shift and Unused Tones," IEEE Transactions on Microwave Theory and Techniques, vol. 57, No. 11, pp. 2682-2691, Nov. 2009.\*

Pascal Philippe, "A Zero Crossing Avoidance Predistortion Technique for Polar Transmitters", Innovation Centre RF NXP Semiconductors, Caen, France, 2008, IEEE, pp. 814-817.

\* cited by examiner

POLAR TRANSMITTER WITH ZERO CROSSING AVOIDANCE

TECHNICAL FIELD

The present disclosure relates generally to digital modulation and more particularly to phase shift keying (PSK) modulation using a polar transmitter.

DISCUSSION OF THE RELATED ART

In a PSK modulation scheme, a bit stream to be modulated is divided into n-bit sequences, and each n-bit sequence is represented by a specific phase shift mapped to the binary code of the n-bit sequence. A $2^n$PSK scheme maps n-bit codes to $2^n$ phase shifts. For instance, in an 8PSK system, eight 3-bit sequences are each mapped to a different phase shift (sequences of 000, 001 . . . 110, 111 may be represented by phase shifts of 0, π/4 . . . π, −3π/4). Each phase shift may be represented as coordinates in an I-Q (In-phase-Quadrature) plane, where I is the abscissa and Q is the ordinate of the IQ plane. Meanwhile, a quality metric used for PSK modulation is Error Vector Magnitude (EVM), which is a measure of how far actual IQ constellation points deviate from their ideal locations.

In a cartesian modulator, separate I and Q signals of the IQ pairs are generated and applied to individual mixers. At the receiver, the I and Q signals are recovered and used to obtain the n-bit sequences.

A polar transmitter is an alternative to the cartesian modulator and operates by converting the I and Q values to amplitude (A) and phase (P) signals. Polar transmitters can achieve substantial power saving by allowing the use of a switching power amplifier and removing the need for the mixers and baseband filters of cartesian modulators.

When an n-bit sequence is represented by a phase shift of π, however, this causes a "zero-crossing" event in IQ space in which an IQ trajectory passes through (or very close to) the origin of the IQ coordinate system. At the time of the zero crossing, the corresponding amplitude A in the polar transmitter is reduced to near zero. This leads to an undesirably large instantaneous FM modulation as the modulation trajectory passes through the origin, which may result in higher bit errors on the receive side. Some wireless protocols have narrow channels that make it difficult to tolerate wide FM modulation. Bluetooth is one such example, where a Bluetooth EDR (Enhanced Data Rate) 3 packet uses 8PSK modulation and the channels are 1 MHz wide. The implementation of a large instantaneous FM modulation via a phase locked loop (PLL) is challenging for all systems, and particularly difficult for non-narrowband systems; therefore, polar architectures are normally reserved for narrowband systems. With a narrow channel, the high instantaneous FM modulation has to be precisely time aligned with the AM modulation to avoid spectral leakage into other channels.

Accordingly, attempts have been made to design polar modulators that avoid zero crossing events, by steering IQ trajectories around the origin, thereby reducing the FM range. Zero crossing avoidance also has additional benefits for an AM modulation path in the polar transmitter: reducing AM modulation bandwidth/slew rate, reducing a requisite dynamic range for the AM path, and reducing the time alignment required between the AM modulation and the large instantaneous FM modulation. However, current zero-crossing avoidance schemes exhibit the drawback of EVM degradation, rendering them unsuitable for applications with specified EVM limits.

SUMMARY

In accordance with the inventive concept, a polar transmitter and method thereof are provided, which generate a zero crossing avoidance signal with frequency characteristics that enable improved performance in terms of EVM, frequency deviation, and reduced power consumption.

In an embodiment, a method for modulating a bit stream involves generating, based on a stream of in-phase (I) and quadrature-phase (Q) ("IQ") symbol pairs, each representing a portion of the bit stream, a filtered IQ waveform representable in IQ space. The filtered waveform is modified to avoid a zero crossing region by intermittently adding thereto a zero crossing avoidance signal with a frequency spectrum comprising at least first and second tones defining first and second peaks on opposite sides of a center-frequency valley. A polar signal is generated, which includes a polar amplitude and phase, based on the modified IQ waveform. An RF carrier is modulated using the polar signal.

In an embodiment, a polar transmitter includes a symbol mapper configured to receive an input bit stream and generate a stream IQ symbol pairs each representing a portion of the bit stream, to obtain an IQ waveform. A pulse shaper low pass filters the IQ waveform to obtain a filtered IQ waveform representable in IQ space. A zero crossing avoidance signal generator generates a zero crossing avoidance signal that is applied during a window encompassing a π phase shift transition, and having a characteristic defined by: a primary peak at a zero crossing time coincident with a zero crossing of the filtered IQ waveform, a first valley at a time between the a start time of the window and the zero crossing time, and a second valley at a time between the zero crossing time and an end time of the window. A delay element delays the filtered IQ waveform to provide a delayed IQ waveform. An adder adds the zero crossing avoidance signal with the delayed IQ waveform to obtain a modified IQ signal. An IQ to polar signal generator converts the modified IQ signal into a polar signal, and a polar modulator modulates an RF carrier using the polar signal.

BRIEF DESCRIPTION OF THE DRAWINGS

The above and other aspects and features of the inventive concept will become more apparent from the following detailed description, taken in conjunction with the accompanying drawings in which like reference numerals indicate like elements or features, wherein.

DETAILED DESCRIPTION OF EMBODIMENTS

The following description, with reference to the accompanying drawings, is provided to assist in a comprehensive understanding of certain exemplary embodiments of the inventive concept disclosed herein for illustrative purposes. The description includes various specific details to assist a person of ordinary skill the art with understanding the inventive concept, but these details are to be regarded as merely illustrative. For the purposes of simplicity and clarity, descriptions of well-known functions and constructions may be omitted when their inclusion may obscure appreciation of the inventive concept by a person or ordinary skill in the art.

Embodiments of the inventive concept provide a zero crossing avoidance scheme for a polar transmitter, which affords lower power consumption as compared to cartesian modulators, and which may exhibit certain advantages over polar transmitters employing conventional zero crossing avoidance schemes. Such benefits may include: avoidance of excessive EVM degradation; a reduction in a requirement for timing alignment between AM (amplitude modulation) and PM (phase modulation) paths of the polar modulation; and a reduction in bandwidth of an amplitude path signal. Meanwhile, embodiments may still meet stringent ACP (adjacent channel power) requirements for certain protocols, such as Bluetooth EDR 3. Thus, embodiments may ease implementation of a polar transmitter, providing reduced power consumption and a clean on-channel signal.

Figure 1:
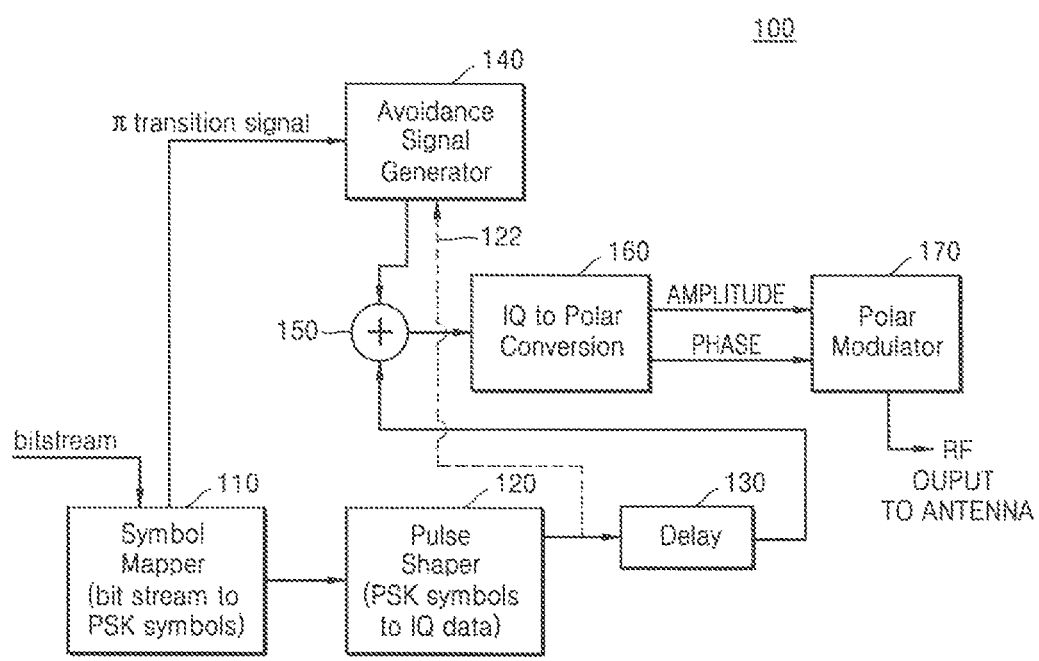
FIG. 1 is a functional block diagram of an embodiment of a polar transmitter in accordance with the inventive concept.

FIG. 1 is a functional block diagram of an embodiment of a polar transmitter, 100, in accordance with the inventive concept. Briefly, polar transmitter 100 functions to PSK modulate an input bitstream by first generating a stream of I and Q symbol pairs ("IQ pairs") and pulse shaping (e.g., through low pass digital filtering) the stream of IQ pairs to provide a filtered IQ waveform in I-Q space. The filtered IQ waveform is then modified to avoid a zero crossing region by intermittently adding a zero crossing avoidance signal (interchangeably, just "avoidance signal") to the IQ waveform. The avoidance signal may have a frequency spectrum with at least first and second tones defining first and second peaks on opposite sides of a zero-frequency (DC) valley (see FIG. 8, discussed later). A polar signal (amplitude and phase) is then generated based on the modified IQ waveform, and an RF carrier is modulated using the polar signal. The unique characteristics of the avoidance signal advantageously generate the modified IQ waveform, and the corresponding polar signal, with a characteristic leading to improved Error Vector Magnitude (EVM) as compared to polar transmitters with conventional avoidance signal approaches.

To this end, the input bitstream to polar transmitter 100 is applied to a symbol mapper 110 which maps the bitstream to PSK symbols, i.e., IQ pairs. Below, an example of 8PSK modulation will be given to explain concepts herein, but the concepts are applicable to any modulation scheme (e.g. 4PSK, 16PSK, etc.) to which it is desired to implement zero crossing avoidance in IQ space. The IQ pairs may be generated substantially in real time in synchronism with the bit stream (with some processing delay) and thus may be referred to herein as a symbol stream or a stream of IQ pairs.

In the symbol mapper 110, IQ pairs with a π transition may be detected, since these symbols will potentially cause a transition of the IQ waveform close to the origin. Symbol mapper 110 may generate a "u transition signal" indicating the same, which is passed to an avoidance signal generator 140. The symbols are also passed to a pulse shaper 120, where a suitable pulse shape is applied to the symbol stream using digital filtering. The output of pulse shaper 120 may be referred herein to as a pulse shaped IQ waveform or a filtered IQ waveform, examples of which will be presented later. The filtered IQ waveform is provided to a delay element 130 where it is delayed while the avoidance signal is generated (if required) by avoidance signal generator 140. The filtered IQ waveform may also be directly provided to avoidance signal generator 140, as indicated by path 122, so that an avoidance signal may be generated with high precision (as explained later).

The avoidance signal output of avoidance signal generator 140 and the delay element 130 output are provided to an adder 150, which adds the delayed and filtered IQ waveform with the avoidance signal to thereby modify the filtered IQ waveform. The latter is output to an IQ to polar conversion block 160 which converts the same to a polar signal having time varying amplitude A(t) and phase P(t) components. Since the modified IQ waveform may be provided in the form of digital samples, IQ to polar conversion block 160 may include a digital to analog (D/A) converter (not shown) to generate the polar signal in analog form. A polar modulator 170 modulates an RF carrier using the polar signal and outputs a modulated RF signal carrying the bit stream information to an antenna for transmission to a receiving device.

Figure 2:
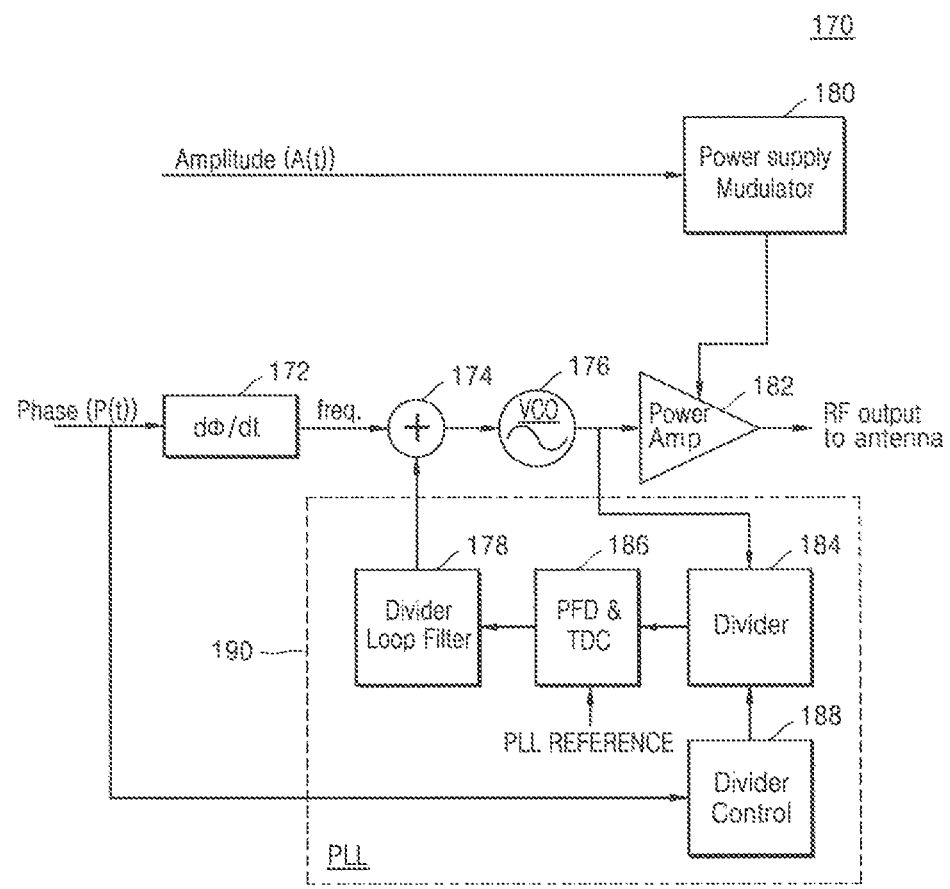
FIG. 2 is a functional block diagram of an example polar modulator that may be used within the polar transmitter of FIG. 1.

FIG. 2 is a functional block diagram of an example polar modulator 170. In this case, polar modulator 170 has a two-point PLL architecture and may include a power supply modulator 180, a phase locked loop (PLL) 190, a phase differentiator 172, an adder 174, a voltage controlled oscillator (VCO) 176 and a power amplifier 182. PLL 190 may include a divider control circuit 188, a divider 184, a phase frequency detector (PFD) and time to digital converter (TDC) block 186 and a divider loop filter 178.

The phase signal P(t) is applied in a main path to phase differentiator 172, which differentiates the same to provide a time varying frequency signal. The addition of the avoidance signal in the underlying IQ waveform modification scheme enables this frequency signal to exhibit reduced deviation, since the phase changes are not as fast as they'd be otherwise. Phase signal P(t) is also applied to divider control circuit 188 of PLL 190. An adder 174 adds the frequency signal from phase differentiator 172 and a PLL feedback signal output by divider loop filter 178, and provides the summed output to VCO 176 to control its oscillation frequency. In the main path, an output signal of VCO 176 is applied as an input signal to power amplifier 182. In this example the VCO output is fed directly to the power amplifier 182 but a driver amplifier (not shown) may optionally be included between VCO 176 and power amplifier 182. In a PLL feedback path, the VCO 176 output signal is fed back to divider 184 which divides the frequency thereof (e.g. by half). Divider 184, which is controlled by divider control circuit 188, sends a divided frequency output signal to PFD & TDC block 186, which compares its frequency to that of a PLL reference frequency applied thereto. PFD &TDC block 186 outputs a difference signal indicative of the difference between the two input signals to divider loop filter 178 which filters this signal and provides the same as the second input to adder 174.

Meanwhile, the amplitude signal A(t) is sent to power supply modulator 180, which modulates the power supply of power amplifier 182 using the amplitude signal to produce amplitude modulation. The output from power amplifier 182 is then sent to the transmitting antenna. A timing alignment circuit(s) (not shown) may be included in the AM and/or PM paths.

Other suitable configurations for polar modulator 170 are available. For instance, polar modulator 170 may alternatively be configured with an Envelope Elimination and Restoration (EE&R) modulator architecture, which does not modulate a VCO. In this design, often called a Kahn EE&R transmitter, an envelope detector is used for the power supply modulator and modulates the power supply of the power amplifier with a variable voltage based on the envelope detection. The phase signal modulates an RF carrier to provide a modulated RF signal that's applied to a limiter (without a PLL). The limiter converts the input to a constant envelope phase signal which is applied to the input of the power amplifier. This type of design exhibits similar power efficiency as the two-point PLL architecture of FIG. 2, without the complexity of modulating the VCO.

The block diagrams of FIGS. 1 and 2 show only major components of a polar transmitter. Other components may be included as needed to fully implement a working transmitter. It is also noted here that symbol mapper 110, pulse shaper 120, delay element 130, adder 150, avoidance signal generator 140 and IQ to polar conversion block 160 may be each be individual circuits. Each of these elements may therefore be called a "circuit". Each of these circuits may be part of a processor that executes instructions read from a memory (not shown) to carry out their specific function. The processor may be a general purpose or special purpose processor.

Polar transmitter 100 may be part of any electronic device for which PSK modulation is desirable. It should also be noted that any same protocol-compatible PSK receiver may be used to receive the RF modulated output of polar transmitter 100. For instance, if polar transmitter 100 is a Bluetooth-compliant transmitter, any conventional or unconventional Bluetooth-compliant receiving device may be employed to receive the transmitted RF modulated signals.

Figure 3:
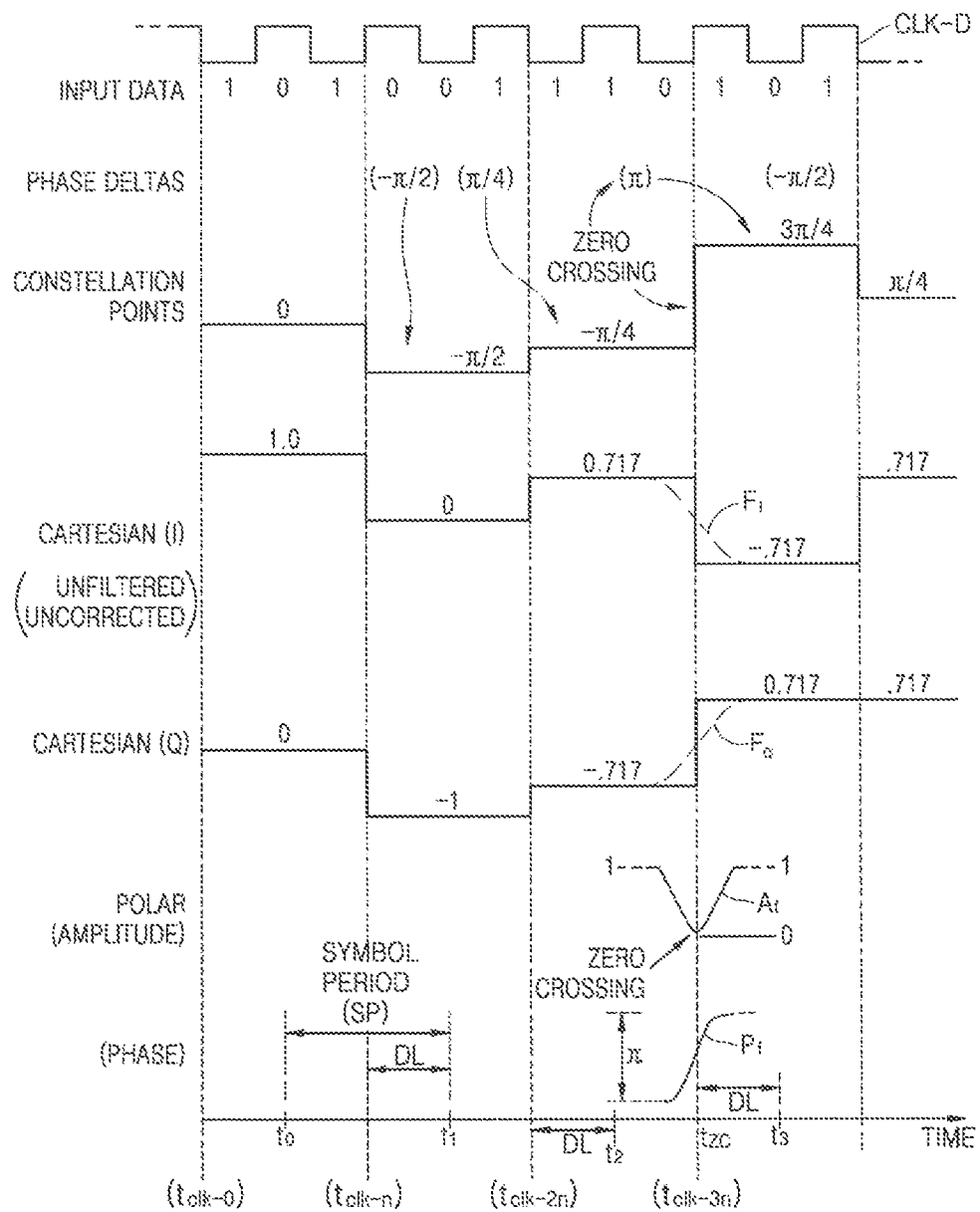
FIG. 3 is a signal diagram with example signals for explaining aspects of zero crossing detection, IQ waveform filtering and polar signal generation in the polar transmitter of FIG. 1.
Figure 4:
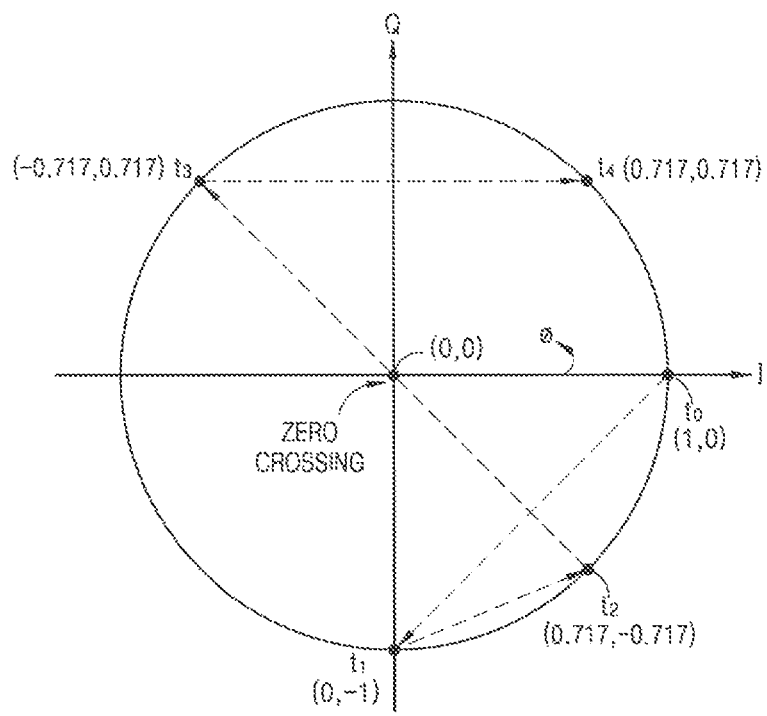
FIG. 4 shows a progression of example unfiltered signals of FIG. 3 in an IQ coordinate system.

FIG. 3 is a signal diagram with example signals for explaining aspects of zero crossing detection, IQ waveform filtering and polar signal generation in polar transmitter 100. FIG. 4 shows a progression of the example signals (unfiltered) in an IQ coordinate system ("IQ space"). In the example, an input bitstream is divided into 3-bit sequences for 8PSK modulation. The input bitstream is mapped to the symbols to produce a symbol stream of IQ pairs that may be understood as an IQ waveform varying with time (also referred to interchangeably as an IQ trajectory). Individual I and Q waveforms may also be considered.

It is assumed at an initial time $t_{CLK\text{-}0}$ synchronized to a data clock CLK-D transition that reception of the input bitstream begins, where the first sequence of the bitstream is 101. An IQ phase constellation point is assumed to be initially set at 0 degrees, corresponding to IQ pair coordinates of (1,0). In an 8PSK modulation example, the 101 sequence is correlated with a phase shift (phase delta) of $-\pi/2$. Thus, at a time $t_1$ following the end of three clock cycles of the bitstream, the constellation phase has shifted by $-\pi/2$, resulting in a current value of $-\pi/2$. (IQ/polar "sample times" $t_0, t_1, t_2, \ldots$ are assumed to be times delayed by a delay DL, due to pulse shaper 120, from a respective data clock transition time $t_{CLK\text{-}0}, t_{CLK\text{-}n}, t_{CLK\text{-}2n}, \ldots$ at the end of an associated n-bit sequence, where n=3 in the current example. Delay DL is shown for diagrammatic simplicity to be about half a symbol period (SP) in duration, but may be longer or shorter. In some cases, delay DL may be in the range of one to five symbols.) This is seen in FIG. 4 as the path traversing from the IQ coordinates at time to $t_0$ those at time $t_1$ of (0, −1). Corresponding unfiltered and uncorrected I and Q waveforms are shown in FIG. 3. The next bit sequence of 001 corresponds to a $\pi/4$ phase change, causing the transition to coordinates (0.717, 0.717) at time $t_2$.

The next bit sequence. 110, correlates to a phase change of $\pi$, moving the phase constellation from $-\pi/4$ at time $t_2$ to $3\pi/4$ at time $t_3$, with IQ coordinates of (−0.717, 0.717). As seen in IQ space, this results in a trajectory passing directly through the IQ space's origin at (0, 0), i.e., a zero crossing event at time $t_{ZC}$ about midway between times $t_2$ and $t_3$. As mentioned earlier, if the zero crossing event were to be carried into polar coordinates and applied to the polar modulator, performance degradation would likely result from the failure to achieve the large instantaneous frequency required, or to synchronize that frequency deviation very precisely with the amplitude modulation. The degradation would likely be in Error Vector magnitude and Adjacent Channel Interference. These potential problems are prevented as polar transmitter 100 circumvents the zero crossing event. Symbol mapper 110 of the polar transmitter 100 detects the $\pi$ transition signal and outputs a $\pi$ transition signal to avoidance signal generator 140 at the time of the detection, whereupon avoidance signal generator 140 generates an avoidance signal between times $t_2$ and $t_3$ to modify the IQ trajectory so that the origin passing is avoided (as seen in FIG. 5B, discussed below). However, prior to applying the avoidance signal, pulse shaper 120 filters the IQ waveform to smooth out the sharp transitions. FIG. 3 shows a portion of a filtered I waveform $F_i$ and a portion of a filtered Q waveform $F_q$. Without the avoidance signal, the filtered IQ waveform $(F_i, F_q)$ may still pass through the origin (0, 0) at time $t_{ZC}$.

As seen in FIG. 3, if the IQ pair is converted to a polar signal without an avoidance signal correction, the polar amplitude A(t) would be zero at time $t_{ZC}$. That is, a polar amplitude of 1 (equaling $(I^2+Q^2)^{1/2}$) transitions rapidly to 0 and then back to 1. A polar signal amplitude waveform "$A_f$" corresponding to the filtered IQ waveform also transitions from 1 to 0 (or nearly zero) and then back to 1. Similarly, an unfiltered polar phase P(t) makes an instantaneous 180 degree transition in the unfiltered case, but the phase trajectories may be smoothed by the pulse shaper 120 filtering to provide a smoother phase waveform $P_f$. Despite the pulse shaping in the IQ domain limiting the bandwidth, however, an instantaneous or near-instantaneous 180 degree transition is possible in the filtered waveform. This is due to the non-linear nature of the transformation from Cartesian to polar expanding the bandwidth of both the amplitude and polar paths.

Figure 5A:
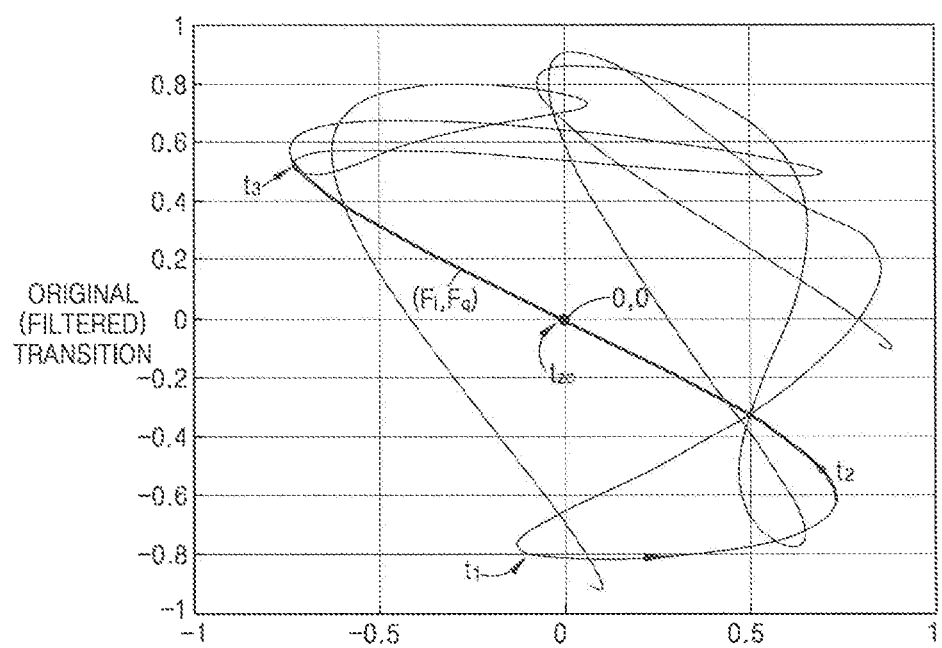
FIG. 5A is a graph depicting an example of a filtered IQ waveform in IQ space.
Figure 5B:
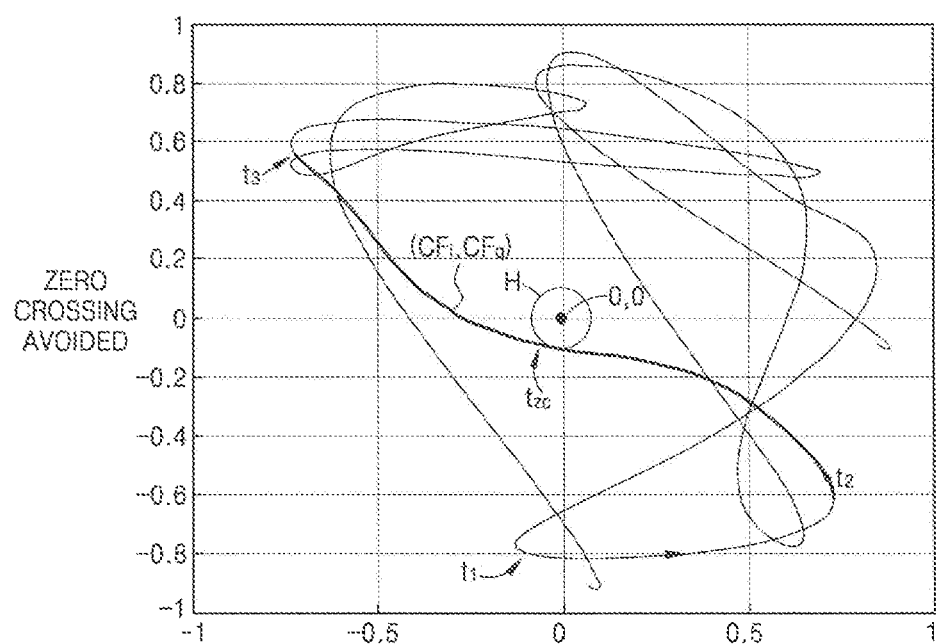
FIG. 5B is a graph depicting an example of the filtered IQ waveform of FIG. 5A after being corrected by a zero crossing avoidance signal generated in accordance with an embodiment.

FIG. 5A is a graph depicting an example of a filtered IQ waveform ($F_i$, $F_q$) in IQ space, output by pulse shaper 120, with a portion of the waveform corresponding to the bit stream shown in FIG. 3 and the IQ constellation of FIG. 4. It is seen in FIG. 5A that the filtering serves to smooth the sharp transitions between phase shifts and also to slightly lower the IQ pair amplitude at the extremes. The time $t_{ZC}$ denotes a time that the filtered waveform crosses through, or closest to, the origin of the IQ space.

FIG. 5B is a graph depicting an example of the filtered IQ waveform of FIG. 5A after being corrected by a zero crossing avoidance signal generated in avoidance signal generator 140. The trajectory of the corrected waveform ($CF_i$, $CF_q$) is shaped to pass outside or along a periphery of a predetermined hole H centered about the origin (0, 0) at time $t_{ZC}$. In addition, the overall trajectory is generally a meandering trajectory between times $t_2$ and $t_3$. Examples of how the avoidance signal and the corrected IQ waveform may be computed are provided later in connection with FIGS. 8-11.

Figure 6:
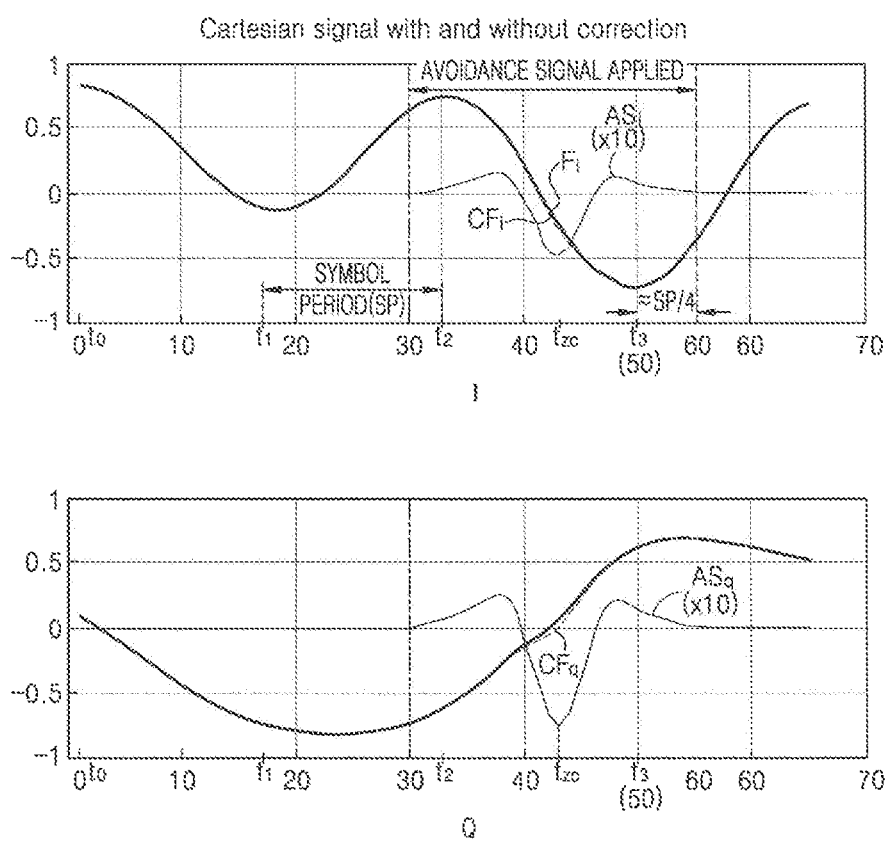
FIG. 6 shows an example comparison of a filtered cartesian waveform with an avoidance signal corrected cartesian waveform according to an embodiment.

FIG. 6 shows an example comparison of a filtered cartesian waveform with an avoidance signal corrected cartesian waveform, in a magnitude vs. time graph. In particular, the individual filtered I waveform $F_i$ and the filtered Q waveform $F_q$ of FIG. 3 (referred to as cartesian signals) are shown over several symbol periods SP of FIG. 3 (where time intervals ($t_1-t_0$), ($t_2-t_1$), . . . between midpoints of adjacent symbols are each one symbol period SP). The waveforms $F_i$, $F_q$, which may be output signals of pulse shaper 120, are shown in comparison to exemplary corrected waveforms $CF_i$, $CF_q$, which may be output signals of adder 150. I and Q components of an avoidance signal AS, i.e., signal $AS_i$ and $AS_q$, are depicted at a 10× scale relative to the filtered and corrected waveforms. The avoidance signal components $AS_i$, $AS_q$ are added to the filtered signal waveforms $F_i$, $F_q$ to arrive at the corrected waveforms $CF_i$, $CF_q$. A slight difference in the waveforms ($CF_i$ vs. $F_i$ and $CF_q$ vs. $F_q$) around the zero crossing time $t_{ZC}$ is observable, which causes the IQ trajectory to change as was seen in FIG. 5B, and avoid the zero crossing. Note that in this example, the avoidance signal AS is applied for more than one symbol period SP. In particular, the avoidance signal is applied in this example for an optimized time of about 1½ symbol periods, e.g., from about ¼ symbol periods before time $t_2$ (~at time ($t_2$-SP/4)) to about ¼ symbol periods after time $t_3$ (~time ($t_3$+SP/4)). In other cases, the avoidance signal may be applied for a shorter or longer duration, which may depend on an optimization criterion. In general, when applied to avoid zero crossing for an isolated π shift, the avoidance signal may be applied for a duration in the range of 1-2 symbol periods centered about the symbol period associated with the zero crossing. FIG. 6 also shows abscissa numbered from 0 to 70 to illustrate that the I and Q waveforms may be digitally computed and stored in terms of time samples. The samples are converted to polar signal samples by IQ to Polar Conversion block 160, where the polar signal samples are D/A converted to output an analog polar signal.

Figure 7:
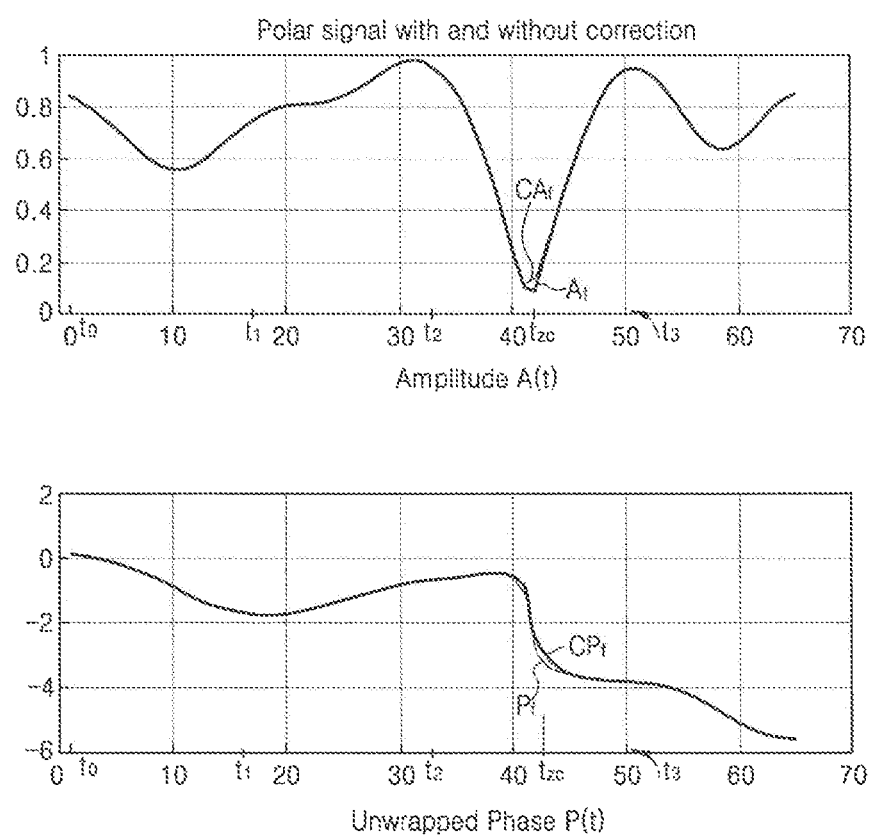
FIG. 7 illustrates an exemplary polar signal generated based on samples of the I and Q waveforms of FIG. 6.

FIG. 7 illustrates an exemplary polar signal generated based on samples of the I and Q waveforms of FIG. 6. In particular, a comparison is shown between the filtered polar signal of FIG. 3 (designated by amplitude $A_f$ and phase $P_f$) and a filtered and avoidance signal corrected polar signal, designated by amplitude $CA_f$ and phase $CP_f$. It is seen that the amplitude $CA_f$ is higher than $A_f$ around the zero crossing time $t_{ZC}$, and the phase change of the waveform $CP_f$ is smoother. These slight changes serve to generate significant performance improvement in terms of EVM and frequency deviation, which is detailed further below.

Figure 8:
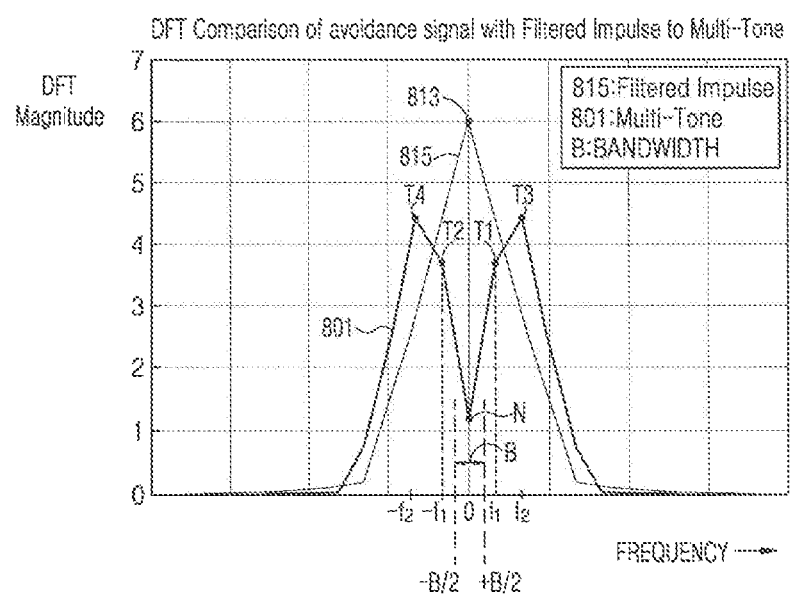
FIG. 8 is a graph illustrating a frequency spectrum comparison between a conventional "filtered impulse" type avoidance signal and an example "multi-tone" avoidance signal in accordance with inventive concept.
Figure 9:
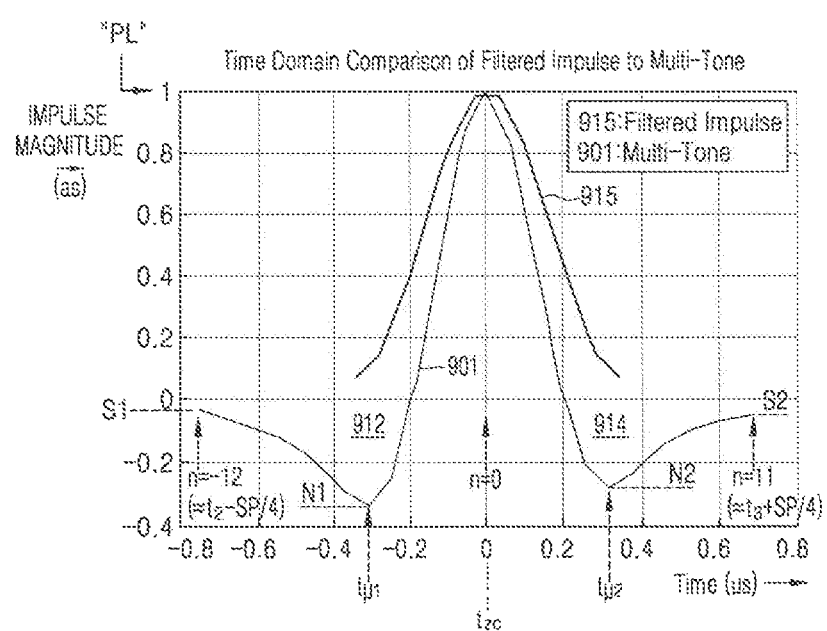
FIG. 9 shows a time domain comparison of the two types of avoidance signals of FIG. 8.

FIG. 8 is a graph illustrating a frequency spectrum comparison between a "filtered impulse" type avoidance signal and an example "multi-tone" avoidance signal in accordance with inventive concept. FIG. 9 shows a time domain comparison of these two types of avoidance signals. Considering first the frequency characteristics of FIG. 8, the different avoidance signal types are exemplified with a plot of DFT (Discrete Fourier Transform) magnitude vs. frequency in each case. DFT magnitude at a discrete frequency is understood as a computed amount of spectral energy at that frequency. A conventional filtered impulse avoidance signal 815 is a signal that pushes out the filtered IQ waveform at the zero crossing with a single impulse at the zero crossing time $t_{ZC}$ (as seen in FIG. 9) and which tapers off with time to zero energy on both sides of the impulse. Avoidance signal 815 has a "hill-shaped" frequency characteristic with peak spectral energy 813 at 0 Hz ("DC", and an example of a center band frequency) and tapering off symmetrically with frequency. When the spectrum is later applied to modulate a carrier during polar modulation, the carrier shifts (in part) by the positive and negative frequencies of the avoidance signal 801, so that 0 Hz in FIG. 8 may be understood to coincide with the carrier frequency.

An example multi-tone avoidance signal 801 may have a frequency spectrum having a local null N at 0 Hz, a first tone T1 with a DFT level higher than the null N level at a positive frequency $f_1$, and a second tone T2 at a negative frequency $-f_1$ also at a level higher than the null N level. In the example of FIG. 8, tones T1 and T2 each have about three times the energy level of the null N at DC, but other ratios are possible. Multi-tone avoidance signal 801 may have a third tone T3 at a frequency $f_2$ higher than $f_1$, with a level higher than the null N level (and which may be higher than the T1 level). Avoidance signal 801 may have a fourth tone T4 at frequency $-f_2$ with a level equaling the T3 level. In the example of FIG. 8, tones T3 and T4 have a level between three and four times that of the null N level, but other ratios may be set.

In an alternative embodiment, avoidance signal 801 may just include the higher tones T3 and T4 and omit tones T1 and T2, such that the frequency spectrum includes the null N and rises linearly to the level of T3 on the positive frequency side and to the level of T4 on the negative frequency side. In either embodiment, the null N at 0 Hz, which rises to a higher level tone on both sides of the spectrum, defines a general characteristic with a center frequency valley. Thus, in either embodiment, avoidance signal 801 may have a frequency spectrum comprising at least first and second tones defining first and second peaks on opposite sides of a center-frequency valley.

The tones T1-T4 may all be "out of band" tones. A signal bandwidth B may be specified for the transmitted RF modulated signal. In an example, the signal bandwidth B may be determined as (1/symbol period). At a receiving device that receives the RF signal, a bandpass filter may be used to recover the information carried just by spectral energy within the bandwidth B. Hence, each of frequencies $f_1$, $-f_1$, $f_2$ and $-f_2$ may be outside the range of $-B/2$ to $B/2$. By way of example, in a Bluetooth protocol application, a narrowband signal channel bandwidth B of +/−0.5 MHz is established for each point to point communication. (Note also that the symbol period may be 1 psec, so that 1/symbol period=1 MHz.) In this case, B/2=0.5 MHz and frequencies $f_1$ and $f_2$ each exceed 0.5 MHz. In a particular example, frequency set ($f_1$, $-f_1$) is +/−1 MHz and ($f_2$, $-f_2$) is +/−2 MHz. In another example implementation for Bluetooth, tones T1 and T2 are omitted and frequency set ($f_2$, $-f_2$) of tones (T3, T4) is +/−1 MHz. The latter design is particularly advantageous for higher power Bluetooth applications.

It has been observed that while the filtered impulse type avoidance signal restricts the bandwidth of zero crossing avoidance, it results in EVM degradation. On the other hand, the multi-tone avoidance signal of the inventive concept has been found to cause minimal EVM degradation, particularly when the tones are all placed outside the signal bandwidth.

FIG. 9 depicts a time domain comparison of a conventional filtered impulse avoidance signal, and a multi-tone avoidance signal according to the inventive concept. In this example, a filtered impulse avoidance signal 915 corresponds to the signal 815 of FIG. 8 and a multi-tone avoidance signal 901 corresponds to the signal 801.

As illustrated, the filtered impulse signal 915 has a time domain characteristic with a peak magnitude at about the zero crossing time $t_{ZC}$ (denoted as 0 μs) and a gradual roll-off to zero energy on both the plus and minus sides of $t_{ZC}$. This produces a sort of bubble shaped trajectory of the IQ waveform in the vicinity of the zero crossing point, while minimally changing the remainder of the trajectory.

The multi-tone avoidance signal 901 may be applied, for each zero crossing event, for a window of time having a time duration optimized for a particular application. (The avoidance signal 901 may also be considered to have a zero magnitude throughout time periods in between the windows during which it is applied.) For instance, the avoidance signal 901 may be applied for a duration in the range of (1-2) or (½-2) symbol periods centered about the symbol period encompassing the zero crossing. In the FIG. 9 example, the avoidance signal is applied for an optimized time of about 1½ symbol periods (from ~−0.75 μs to +0.75 μs) for a symbol period of 1 μs. By applying the avoidance signal for longer than one symbol period, a long window function can be used, thus allowing for more filtering of the tones. This limits the spread of their energy into the signal bandwidth or higher frequencies. For example, with reference to the bit stream and mapped symbol timing example of FIGS. 3-7, the avoidance signal 901 may be applied from around an avoidance signal start time (AS start time) of ($t_2$−SP/4) to an avoidance signal end time (AS end time) of ($t_3$+SP/4). Generally, the avoidance signal 901 may be applied from around a π transition start time to a π transition end time, which may be said to correspond to a portion of the filtered IQ waveform approximately coinciding with a π phase shift.

Multi-tone avoidance signal 901 has a peak energy "PL", hereafter called a "primary peak", around the zero crossing point at time $t_{ZC}$. (Note that the delay element 130 of FIG. 1 enables the avoidance signal 901 to be added to the filtered IQ waveform at the right timing so that the primary peak is added to the filtered IQ waveform at time $t_{ZC}$.) The remainder of the trajectory, as a function of time, differs from the filtered impulse signal 915 by including a first valley region 912 between the AS start time and the primary peak; and a second valley region 914 between the primary peak and the AS end time. First valley region 912 has a first valley null at a time tµ1 with a level N1 lower than a level S1 at the AS start time. Second valley region 914 has a valley null at a time to tµ2 having a level N2 lower than a level S2 at the AS end time. In an example, N1 and N2 each have a voltage polarity opposite to that of PL. This causes the filtered IQ waveform to be pushed in a first direction at the time $t_{ZC}$ of the primary peak, and to be pushed in an opposite direction at the times of the valley regions 912 and 914 (as seen later in reference to FIG. 12). This type of energy distribution leads to benefits such as improved EVM as compared to the conventional filtered impulse scheme.

In the particular example of FIG. 9, the peak level PL is about 1 unit of magnitude; valley null levels N1, N2 are each between −0.2 and −0.4 units; and the start time and end time levels S1, S2 are each between 0 and −0.1 units.

Figure 10:
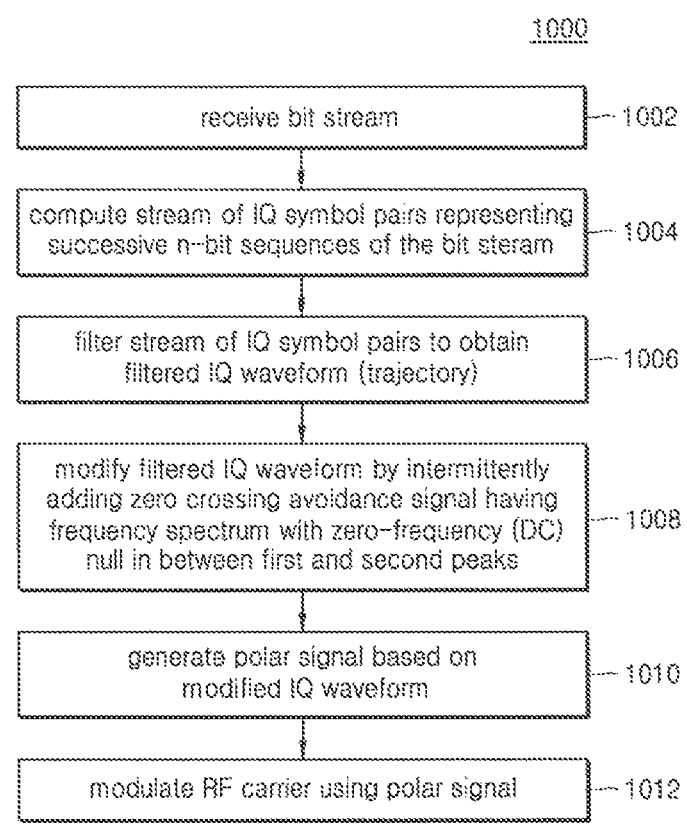
FIG. 10 is a flow chart of an example method for digital modulation in accordance with the inventive concept.

FIG. 10 is a flow chart of an example method, 1000, for digital modulation performed by polar transmitter 100 in accordance with the inventive concept. A bit stream is received (1002) and a stream of IQ symbol pairs is computed (1004) by symbol mapper 110, representing successive n-bit sequences of the bit stream. The stream of IQ symbol pairs is low pass filtered 1006 by pulse shaper 120 to obtain a filtered IQ waveform (which may interchangeably be referred to a filtered IQ trajectory). Here, symbol mapper 110 may use a conventional low pass digital filtering technique to compute and store a sequence of discrete samples representing a time varying IQ trajectory, such as uniformly spaced samples of the waveforms $F_i$ and $F_q$ of FIG. 6.

The IQ filtered waveform is then modified (1008) using avoidance signal generator 140, delay element 130 and adder 150 by intermittently adding a zero crossing avoidance signal to the filtered IQ waveform. As explained above in connection with FIG. 8, a zero crossing avoidance signal in accordance with the inventive concept may have a frequency spectrum with a zero-frequency (DC) null in between first and second peaks, and may be generated and added only around times that a π phase shift transition are detected. A polar signal is then generated (1010) by IQ to polar conversion block 160 based on the modified IQ filtered waveform. An RF carrier is then modulated (1012) by polar modulator 170 and outputted to an antenna for wireless transmission, where the modulated output carries the information of the bit stream.

Figure 11:
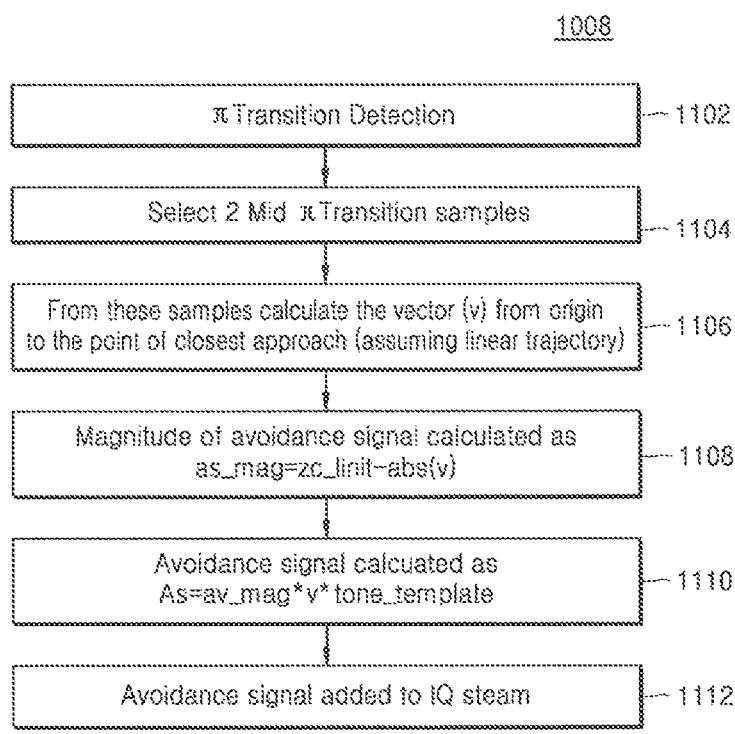
FIG. 11 is a flow chart of an example method for modifying a filtered IQ waveform by adding a zero crossing avoidance signal in accordance with an embodiment, and is an example method for implementing operation 1008 of FIG. 10.

FIG. 11 is a flow chart of an example method for modifying a filtered IQ waveform by adding a zero crossing avoidance signal in accordance with the inventive concept. In particular, FIG. 11 is an example method for implementing operation 1008 of FIG. 10. Operations of FIG. 11 will be explained with reference to FIG. 9 and FIG. 12, where the latter shows example trajectories of a filtered IQ waveform and an avoidance signal corrected (and filtered) IQ waveform.

Figure 12:
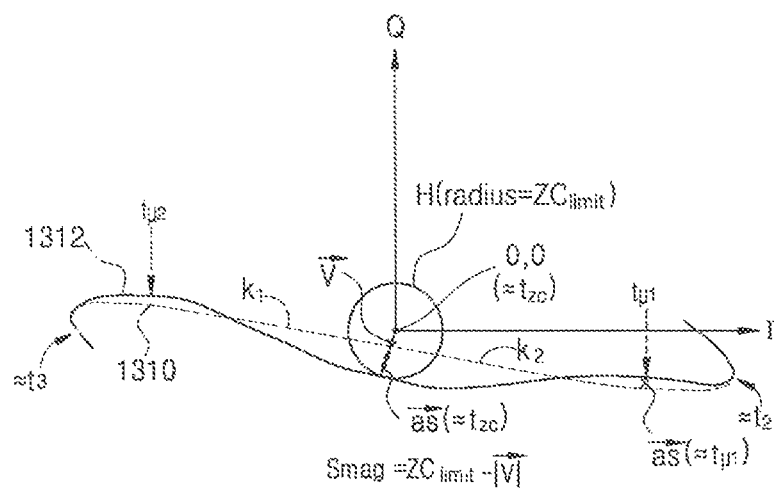
FIG. 12 shows example trajectories of a filtered IQ waveform and an avoidance signal corrected (and filtered) IQ waveform according to an embodiment.

A π transition is detected (1102) by symbol mapper 110, whereupon avoidance signal generator 140 initiates generation of an avoidance signal. The avoidance signal may be based on the filtered IQ waveform received directly from pulse shaper 120 (along signal path 122 of FIG. 1). To this end, for a π transition, avoidance signal generator 140 may select two mid transition samples (1104) to calculate a vector ($\vec{V}$) from the origin to the point of closest approach of the trajectory (1106). This may be done assuming a linear trajectory through the two samples. For instance, as seen in FIG. 12, a filtered IQ waveform (trajectory) 1310 in IQ space, represented as dotted samples, may begin a π transition at a start time $t_2$, where the transition approaches the origin (0, 0) at time $t_{ZC}$ and ends at end time $t_3$. Two mid transition samples k1 and k2 may be used to calculate the vector ($\vec{V}$). (Note that the π transition of FIG. 12 differs from that of FIGS. 3-7 by beginning near (1,0) corresponding to phase=0 and ending near (−1,0) corresponding to phase=T.)

As an alternative to the operation of selecting two mid transition samples (1104) to calculate the vector ($\vec{V}$) of closest approach, this may be accomplished in different ways. For a highly oversampled system it may be done from the closest point, but it is also possible to calculate it from knowledge of the pulse shape and the symbols before and after the π transition.

The method may then calculate (1108) the magnitude of the avoidance signal assuming a predefined circular hole H centered about the origin with a radius specified as $zc_{limit}$.

The magnitude $s_{mag}$ of a desired avoidance vector $\vec{as}$ at the time $t_{ZC}$ may be calculated as, $$s_{mag} = zc_{limit} - |\vec{v}|,$$

where the avoidance vector $\vec{as}$ at the time $t_{ZC}$ may be a vector pointing in the same direction as the vector $|\vec{v}|$. In FIG. 12, the waveform 1312 denotes the filtered IQ waveform modified (corrected) with the avoidance signal. It is seen that the uncorrected waveform 1310 is pushed out by the origin in the direction of $\vec{as}(t_{ZC})$ at the origin, but is pushed in the opposite direction around times tµ1 and tµ2. As should be understood from FIG. 9, this is due to the valleys 912 and 914 of the avoidance vector as being set with opposite polarity to the primary peak.

To compute values for the avoidance signal throughout the 10 trajectory from a starting time (e.g. $t_2$) to an ending time (e.g. $t_3$) based on the vector v, the avoidance 20 signal may then be calculated (1110) as $$\vec{as} = s_{mag} * \vec{v} * \text{tone\_template},$$

where "tone_template" may be fixed for all correction signals. In general, tone_template may be determined as follows: assume the avoidance vector $\vec{as}$ has values at each of n samples beginning from a (−n/2)th sample to a ((n−1)/2)th sample, including a sample at n=0 (here, the sample number "n" should not be confused with "n-bit data" discussed earlier). Tone_template across the range of n samples may then be determined as tone_template(n)=(h(n)/(k1+k2))×(k1 cos(w1×2πxn)/(OSR))+(k2 cos(w2×2πxn)/(OSR))

where OSR is an oversampling ratio=number of samples per symbol, i.e., IQ pair duration (e.g., the duration from time $t_2$ to time $t_3$); h(n) is a filtering window function, and k1, w1, w2 and k2 are constants.

In the above equation, the (k1 cos(w1×2πxn)/(OSR)) term may be understood as generating the tones T1 and T2 in the spectral example of FIG. 8, and the (k2 cos(w2×2πx n)/(OSR)) may be understood as generating the tones T3 and T4 in FIG. 8. The variables w1 and w2 determine a shape of the trajectory. For instance, considering the time domain plot of FIG. 9, if w1 and w2 are set larger than that used to generate the waveform 901, several "valley nulls and peaks" could be generated on each side of the primary peak.

Pre-computed values for each sample number n of tone_template may be stored in a look up table (e.g. memory residing within avoidance signal generator 140), or alternatively the tone_template values are generated for each correction signal.

The filtering window function h(n) may be a Hamming window function. Some examples of alternative window functions include a Hann window, a Blackman window, a Gaussian window, a Nutall window, a Blackman-Nutall window and a Blackman-Harris window.

In the specific examples of FIGS. 8 and 9, tone_template may be calculated from the following pseudo code:

for $n = -12:11$ $$tonetemplate(n) = \frac{h(n+13)}{8}\left(2\cos\left(\frac{2*2\pi*n}{16}\right) + 6\cos\left(\frac{2\pi*n}{16}\right)\right)$$

End

For this pseudocode, the variable n denotes a sample number and h is a hamming window function of length 24. Thus, there are 24 samples, i.e., from n=−12 to +11 (with 0 included as one sample). In the example, the sampling rate is 16 (e.g. 16 samples per symbol=16 samples per MHz for a 1 MHz symbol rate). If a different oversampling ratio is desired, these variables may change appropriately.

The above examples assume two sets of tones are used, but more than two sets of tones may be generated in other embodiments. Thus, tone_template may be generally determined by:

$$tonetemplate(n) = \left(\frac{h(n)}{\sum_{i=1}^{p} k_i}\right) * \sum_{i=1}^{p} k_i \cos\left(\frac{w_i * 2\pi * n}{OSR}\right)$$

where h is a suitable indexed window function, p is the number of tones, and w may be any number greater than OSR/2.

The hamming window function, or other suitable window function, may serve to prevent spectral leakage from the avoidance signal increasing to an undesirable level that may degrade both the EVM and ACP (adjacent channel power).

After the avoidance vector $\vec{as}$ has been calculated it may be added (1112) into the corresponding section of the IQ samples, to arrive at the corrected IQ waveform, e.g. waveform 1312 of FIG. 12. As mentioned, since a desirable shape for the avoidance vector includes valleys 912 and 914 (FIG. 9) having opposite polarity to the primary peak, the corrected waveform 1312 may differ from the uncorrected waveform 1310 by being pushed out at the origin in the direction of $\vec{as}(t_{ZC})$, and pushed (by a lesser degree) in the opposite direction around intermediate times tµ1 and tµ2. Simulations summarized below demonstrate performance benefits by implementing this type of avoidance signal waveform.

It is noted here that the method of FIG. 11 may be modified in the following manner: instead of the π transition detection in operation 1104 by symbol mapper 110 (which was described as detecting the π transition and providing a r transition signal to avoidance signal generator 140), the detection of the π transition can alternatively be made by direct observation (by avoidance signal generator 140) of the magnitude of the IQ data output from pulse shaper 120 along path 122. If the IQ data represents <$zc_{limit}$, then it may be determined that a zero crossing avoidance signal is needed at that point, and can be constructed on this basis.

Embodiments of the inventive concept as described above may advantageously allow a requisite frequency from the PLL 190 for a particular specification such as Bluetooth EDR 3 to be reduced, but without the degradation of EVM as caused by a standard filtered impulse (e.g. with spectrum 815 of FIG. 8 or waveform 915 of FIG. 9). Table 1 below compares simulation results of a multi-tone avoidance signal embodiment (denoted "Out of band") as described above, to a standard filtered impulse implementation of zero cross avoidance. In this comparison, Bluetooth EDR 3 parameters are assumed, which include a channel bandwidth of 1 MHz, Bluetooth-compliant data rates, and RF frequency in the 2.4-2.48 GHz range. In Table 1, "Baseline" denotes a polar transmitter architecture without any avoidance signal correction. "Impulse size" denotes a magnitude of the circular hole H radius around the origin, where the avoidance signal is assumed to tangentially pass a circumferential point of the hole H in all cases (excluding the Baseline case). "Out of band" denotes a polar transmitter utilizing a multi-tone avoidance signal with a spectrum such as that shown in FIG. 8.

Maximum frequency deviation is the largest deviation of the VCO output frequency from the nominal carrier frequency for a given sample. In a polar system the VCO frequency is updated at the reference frequency of the PLL. Hence, with no zero crossing avoidance (the Baseline case) and a π transition, the maximum deviation is 7.45 MHz, which is close to ref_freq/2 (in Table 1 the ref_freq=16 MHz). In the example it is desired to reduce the maximum frequency deviation below the 7.45 MHz of the Baseline design. It is seen in Table 1 that for various impulse sizes, both the Out of band case and the Filtered Impulse case reduce the maximum frequency deviation significantly to about the same levels, but the Out of band case exhibits substantially better EVM performance. Thus, the reduction in maximum frequency deviation is obtained without the excessive EVM degradation as in the Filtered Impulse case.

Figure 14:
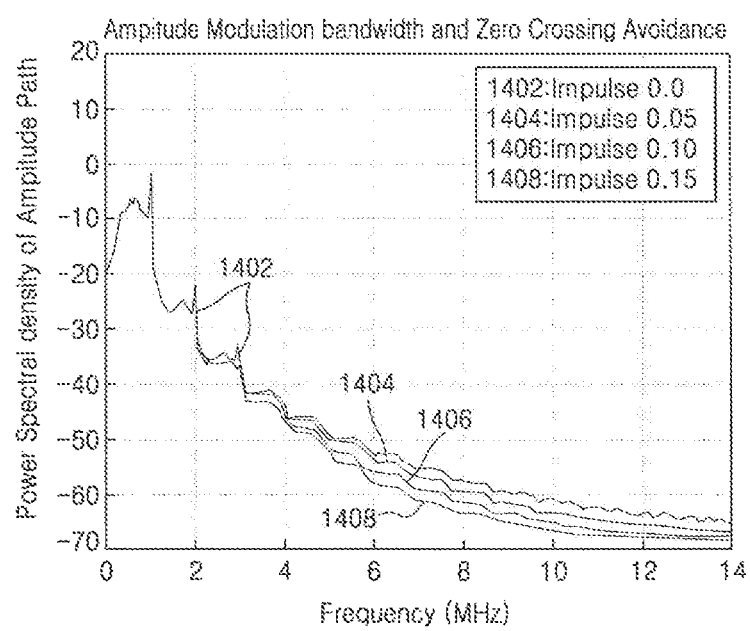
FIG. 14 is a graph illustrating a simulated result showing power spectral density of an Amplitude path vs. frequency, for an exemplary embodiment disclosed herein.

FIG. 14 is a graph illustrating a simulated result showing power spectral density of the Amplitude path vs. frequency, for the exemplary cases in Table 1. Plot 1402 representing an Impulse of 0.0 corresponds to the Baseline case. Impulses of 0.05, 0.10 and 0.15 (plots 1404, 1406 and 1408, respectively) are candidates for Out of band embodiments. It is seen that each of the Out of band embodiments exhibits a reduction in the bandwidth of the signal on the Amplitude path. As illustrated, the amount of signal at higher frequencies is reduced, which reduces the bandwidth requirement of this path and renders the configuration easier to manufacture.

Figure 15:
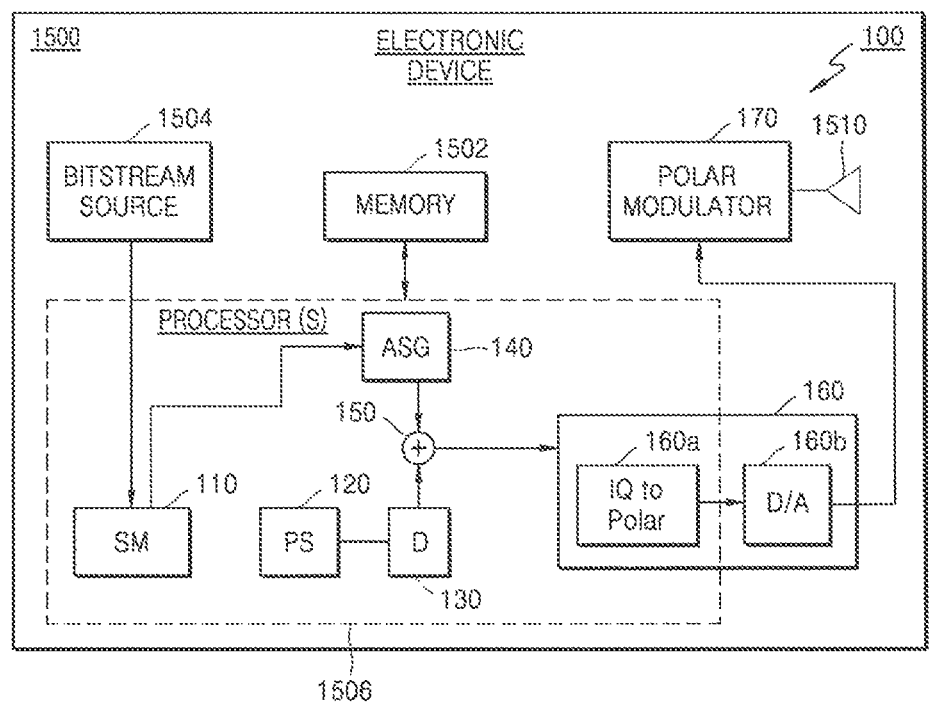
FIG. 15 is a functional block diagram of an example electronic device that includes the polar transmitter of FIG. 1.

FIG. 15 is a functional block diagram of an example electronic device, 1500, that includes the above-described polar transmitter 100. Electronic device 1500 may be any electronic device that may benefit from the inclusion of a PSK modulator with reduced power consumption. Examples include any Bluetooth-compliant device, smartphones, tablets, laptops, and so forth. Electronic device 1500 has an example configuration in which processor(s) 1506 comprises each of symbol mapper 110, pulse shaper 120, delay element 130, adder 150 and avoidance signal generator 140. IQ to polar conversion block 160 is exemplified as comprising a digital IQ to polar portion 160a, which is part of processor 1506, and a D/A converter portion 160b which converts the digital samples of the polar signal output by IQ to polar portion 160a to an analog polar signal, which is provided to polar modulator 170. A bitstream source 1504 may provide the above-discussed bitstream to symbol mapper 110. Processor(s) 1506 is coupled to a memory 1502 which may store instructions executed by processor(s) 1506 to carry out the above-described functions of the various components thereof. Memory 1502 may be used for interim storage by any of the components of processor(s) 1506, and may also store the above-mentioned look-up table, if included, for storing the tone_template. Polar modulator 170 provides the modulated RF signal to antenna 1510. All elements shown within electronic device 1500, aside from bitstream source 1504 and antenna 1510, may be part of polar transmitter 100. Electronic device 1500 may include many other elements (not shown) to carry out various

TABLE 1

| Method | Impulse Size | Max Frequency Deviation (MHz) | EVM | | |
|---|---|---|---|---|---|
| | | | RMS (%) (Spec 13%) | <99% symbols (%) (Spec 20%) | Peak (%) (Spec 25%) |
| Baseline | 0 | 7.45 | 0.2 | 0.3 | 0.4 |
| Filtered Impulse | 0.05 | 5.7 | 1.0 | 3.3 | 4.4 |
| Out of band | 0.05 | 5.7 | 0.3 | 0.8 | 1.4 |
| Filtered Impulse | 0.10 | 4.0 | 2.0 | 7.6 | 8.9 |
| Out of band. | 0.10 | 4.1 | 0.7 | 1.9 | 2.5 |
| Filtered Impulse | 0.15 | 3.4 | 4.0 | 12.2 | 13.3 |
| Out of band | 0.15 | 3.4 | 1.2 | 3.0 | 3.5 |

It is noted here that a supplementary advantage of the Out of band configuration is that it reduces the requirement on timing alignment between the AM and PM paths of the polar modulator 170.

Figure 13:
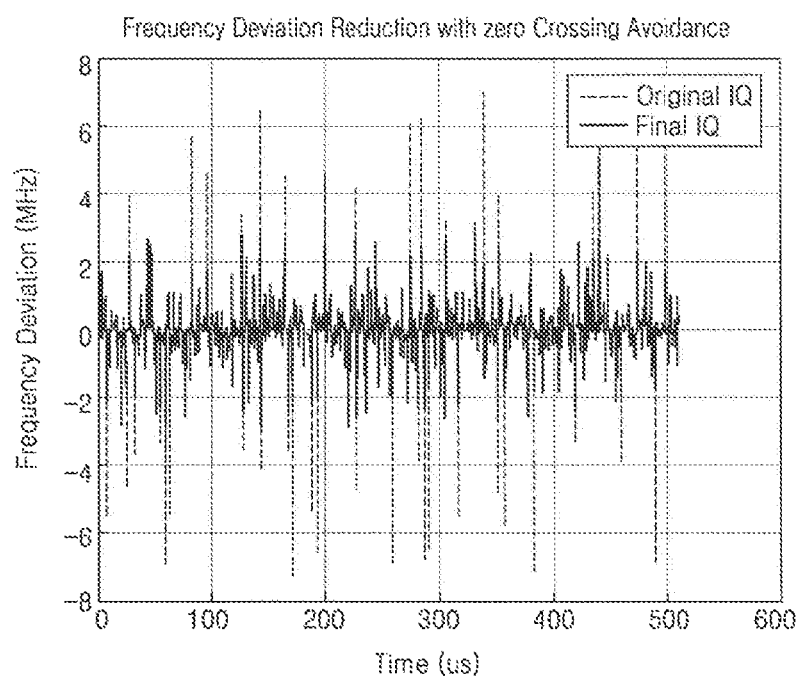
FIG. 13 shows a graph depicting maximum frequency deviation of an uncorrected polar transmitter as compared to a polar transmitter according to an embodiment disclosed herein.

FIG. 13 shows a graph depicting the maximum frequency deviation of the Baseline case ("Original IQ") vs. the Out of band case ("Final IQ") of Table 1. It is seen that in the Baseline case, frequency deviation spikes markedly over a one symbol duration, whereas the zero avoidance implementation of the inventive concept limits such spikes considerably.

functionality, such as a PSK receiver to wirelessly receive and demodulate PSK signals transmitted by a counterpart device.

Various elements described above have been described with labels consistent with their functionality, but are embodied with hardware circuitry. In this regard, elements such as the above-discussed symbol mapper, pulse shaper, delay element, adders, and avoidance signal generator, IQ to polar conversion block, phase differentiator, divider, PFD & TDC block, and divider loop filter may be alternatively called a symbol mapper circuit, pulse shaper circuit, . . . , divider loop filter circuit, respectively.

Exemplary embodiments of the inventive concept have been described herein with reference to signal arrows, block diagrams and algorithmic expressions. Each block of the block diagrams, and combinations of blocks in the block diagrams, and operations according to the algorithmic expressions can be implemented by hardware accompanied by computer program instructions. Such computer program instructions may be stored in a non-transitory computer readable medium such as a CD ROM, RAM, a floppy disk, a hard disk, or a magneto-optical disk or computer code downloaded over a network, so that the methods described herein can be rendered using such software that is stored on the recording medium using a general purpose computer, or a special processor or in programmable or dedicated hardware, such as an ASIC or FPGA, that can direct a computer, other programmable data processing apparatus, or other devices to function in a particular manner, such that the instructions stored in the computer readable medium produce an article of manufacture including instructions which implement the function/act specified in the flowchart and/or block/schematic diagram.

The term "processor" as used herein is intended to include any processing device, such as, for example, one that includes a central processing unit (CPU) and/or other processing circuitry (e.g., digital signal processor (DSP), microprocessor, etc.). Moreover, a "processor" includes computational hardware and may refer to a multi-core processor that contains multiple processing cores in a computing device. Various elements associated with a processing device may be shared by other processing devices.

While the inventive concept described herein has been particularly shown and described with reference to example embodiments thereof, it will be understood by those of ordinary skill in the art that various changes in form and details may be made therein without departing from the spirit and scope of the claimed subject matter as defined by the following claims and their equivalents.

What is claimed is:

1. A method for modulating a bit stream, comprising:
   using a processor, generating, based on a stream of in-phase (I) and quadrature-phase (Q) ("IQ") symbol pairs, each representing a portion of the bit stream, a filtered IQ waveform representable in IQ space;
   modifying, using the processor, the filtered IQ waveform to avoid a zero crossing region in the IQ space by intermittently adding thereto a zero crossing avoidance signal with a frequency spectrum comprising at least first and second tones defining first and second peaks on opposite sides of a center frequency valley;
   generating a polar signal comprising a polar amplitude and phase, based on the modified filtered IQ waveform; and
   modulating a radio frequency (RF) carrier using the polar signal.

2. The method of claim 1, wherein intermittently adding the zero crossing avoidance signal comprises:
   generating, and adding to the filtered IQ waveform, the zero crossing avoidance signal each time the portion of the bitstream matches a bit sequence for generating a phase shift keyed (PSK) 180 degree phase shift.

3. The method of claim 1, wherein the center frequency valley is at zero Hz, the first tone is at a frequency "f" and the second tone is at a frequency of −f.

4. The method of claim 1, wherein the RF carrier is a Bluetooth EDR 3 compliant RF carrier.

5. The method of claim 1, wherein the zero crossing avoidance signal is intermittently applied in windows each having a duration in the range of (½-2) symbol periods centered about a symbol period encompassing the zero crossing region in the IQ space.

6. The method of claim 1, wherein the zero crossing avoidance signal is intermittently applied in windows each having a duration of about 1 symbol periods centered about a symbol period encompassing the zero crossing region in the IQ space.

7. The method of claim 1, further comprising computing a magnitude of the zero crossing avoidance signal by:
   defining a circular hole with a radius $zc_{limit}$ around an origin of the IQ space;
   calculating a vector $\vec{v}$ from the origin of the IQ space to a point of closest approach of the filtered IQ waveform; and
   calculating a magnitude $s_{mag}$ of the zero crossing avoidance signal at the point of closest approach as, $$s_{mag} = zc_{limit} - |\vec{v}|.$$

8. The method of claim 3, wherein:
   a frequency bandwidth B is allocated to the modulated RF carrier; and
   the frequency f is greater than B/2.

9. The method of claim 7, wherein the zero crossing avoidance signal is defined as an avoidance vector $\vec{as}$ having values at each of n samples beginning from a (−n/2)-th sample to a ((n−1)/2)-th sample, including a sample at n=0, wherein the avoidance vector $\vec{as}$ is defined as $$\vec{as} = s_{mag} * \vec{v} * \text{tonetemplate}$$

where, $$\text{tonetemplate} = (h(n)/(k1+k2)) \times (k1 \cos(w1 \times 2\pi \times n)/(OSR)) + (k2 \cos(w2 \times 2\pi \times n)/(OSR))$$

where OSR is an oversampling ratio equaling a number of samples per symbol; h(n) is a filtering window function, and k1, w1, w2 and k2 are constants.

10. The method of claim 7, wherein the zero crossing avoidance signal is defined as an avoidance vector $\vec{as}$ having values at each of n samples beginning from a (−n/2)-th sample to a ((n−1)/2)-th sample, including a sample at n=0, wherein the avoidance vector $\vec{as}$ is defined as $$\vec{as} = s_{mag} * \vec{v} * \text{tonetemplate}$$

where, $$\text{tonetemplate}(n) = \left(\frac{h(n)}{\sum_{i=1}^{p} k_i}\right) * \sum_{i=1}^{p} k_i \cos\left(\frac{w_i * 2\pi * n}{OSR}\right)$$

where h is an indexed window function, p is a number of tones of the at least first and second tones, k is a constant, OSR is an oversampling ratio, and w is a number greater than OSR/2.

11. The method of claim 8, wherein the frequency spectrum comprises a third tone in between frequencies B/2 and f, and a fourth tone in between frequencies −B/2 and −f.

12. The method of claim 9, wherein h(n) is a hamming window function.

13. The method of claim 11, wherein B/2 equals 0.5 MHz, f equals 1.0 MHz, and the third tone is at 2.0 MHz.

14. A polar transmitter comprising:
a symbol mapper circuit configured to receive an input bit stream and generate a stream of in-phase (I) and quadrature-phase (Q) ("IQ") symbol pairs each representing a portion of the bit stream, to obtain an IQ waveform;
a pulse shaper circuit configured to low pass filter the IQ waveform to obtain a filtered IQ waveform representable in IQ space;
a zero crossing avoidance signal generator circuit configured to generate a zero crossing avoidance signal that is applied during a window encompassing a π phase shift transition, and having a characteristic defined by a primary peak at a zero crossing time coincident with a zero crossing of the filtered IQ waveform, a first valley at a time between a start time of the window and the zero crossing time, and a second valley at a time between the zero crossing time and an end time of the window;
a delay circuit configured to delay the filtered IQ waveform to provide a delayed IQ waveform;
an adder circuit configured to add the zero crossing avoidance signal with the delayed IQ waveform to obtain a modified IQ signal;
an IQ to polar conversion circuit configured to convert the modified IQ signal into a polar signal; and
a polar modulator circuit configured to modulate a radio frequency (RF) carrier using the polar signal.

15. The polar transmitter of claim 14, wherein the first valley has a first null at a first null level, the second valley has a second null at a second null level, the primary peak represents a first voltage polarity, and each of the first null level and the second null level represents a second voltage polarity opposite the first voltage polarity.

16. The polar transmitter of claim 14, wherein the RF carrier is a Bluetooth EDR 3 compliant RF carrier.

17. The polar transmitter of claim 14, wherein the polar signal comprises an amplitude signal and a phase signal, and the polar modulator circuit comprises:
a power amplifier;
a power supply modulator configured to modulate a power supply of the power amplifier using the amplitude signal;
a phase differentiator configured to differentiate the phase signal into a frequency signal;
a voltage controlled oscillator (VCO) coupled to an input terminal of the power amplifier;
an adder coupled between the phase differentiator and the VCO; and
a phase locked loop (PLL) configured to receive the phase signal as a first input, an output signal of the VCO as a second input, a PLL reference signal as a third input, and to generate therefrom a PLL feedback signal;
wherein the adder adds the frequency signal and the PLL feedback signal to obtain an addition signal, which is applied as an input to the VCO.

18. The polar transmitter of claim 14, wherein the polar modulator circuit has an Envelope Elimination and Restoration modulator architecture.

19. The polar transmitter of claim 14, wherein the symbol mapper circuit, the pulse shaper circuit, the zero crossing avoidance signal generator circuit, the delay circuit, the adder circuit, and a portion of the IQ to polar conversion circuit are implemented by a common processor that reads execution instructions from a memory.

20. A non-transitory computer-readable recording medium storing instructions that, when executed by at least one processor, implement a method for modulating a bit stream, the method comprising:
generating, based on a stream of in-phase (I) and quadrature-phase (Q) ("IQ") symbol pairs each representing a portion of the bit stream, a filtered IQ waveform in I-Q space;
modifying, using the at least one processor, the filtered IQ waveform to avoid a zero crossing region in the I-Q space by intermittently adding thereto a zero crossing avoidance signal with a frequency spectrum comprising at least first and second tones defining first and second peaks on opposite sides of a center-frequency valley;
generating a digital polar signal comprising a digital polar amplitude and phase, based on the modified filtered IQ waveform; and
outputting the digital polar signal to a digital to analog converter for subsequent modulation of a radio frequency (RF) carrier using the polar signal.

* * * * *